United States Patent [19]

Depauw et al.

[11] Patent Number: 5,153,054
[45] Date of Patent: * Oct. 6, 1992

[54] COATED GLAZING MATERIAL

[75] Inventors: Jean-Michel Depauw, Brussels; Jean-Claude Hoyois, Ham-sur-Heure, both of Belgium

[73] Assignee: Glaverbel, Brussels, Belgium

[*] Notice: The portion of the term of this patent subsequent to May 5, 2009 has been disclaimed.

[21] Appl. No.: 458,385

[22] Filed: Dec. 28, 1989

[30] Foreign Application Priority Data

Jan. 5, 1989 [GB] United Kingdom ............... 8900165

[51] Int. Cl.$^5$ ............ B32B 7/02; B32B 15/04
[52] U.S. Cl. .................... 428/216; 428/336; 428/469
[58] Field of Search ......... 204/192.32, 192.35, 204/192.27; 428/457, 469, 216, 336

[56] References Cited

U.S. PATENT DOCUMENTS 4,428,810 1/1984 Webb et al. ............... 204/192.32
4,790,922 12/1988 Huffer .

FOREIGN PATENT DOCUMENTS 0104870 4/1984 European Pat. Off. .
0183052 6/1986 European Pat. Off. .
0219273 4/1987 European Pat. Off. .
0226993 7/1987 European Pat. Off. .
0275474 7/1988 European Pat. Off. .
0304234 8/1988 European Pat. Off. .

Primary Examiner—Thomas J. Herbert, Jr.
Attorney, Agent, or Firm—Spencer, Frank & Schneider

[57] ABSTRACT

A substrate of glazing material carries a multi-layer coating which comprises a reflective layer of silver sandwiched between a transparent undercoat and a transparent overcoat. The undercoat for the silver layer comprises at least one layer of a metal oxide. The overcoat for the silver layer comprises a layer of an oxide of a sacrificial metal selected from the group consisting of titanium, aluminum, stainless steel, bismuth, tin and mixtures of two or more thereof, which is formed by initial deposition of the sacrificial metal and its conversion to oxide over which is deposited a layer of zinc oxide having a thickness not greater than 15 nm, and an uppermost overcoating layer of metal oxide selected from the group consisting of tin oxide, bismuth oxide, aluminum oxide, titanium dioxide and mixtures of two or more thereof. For forming a low emissivity coating with good light transmission, the silver layer is 8 to 12 nm thick. A specific multi-layer low emissivity coating is formed by depositing the following layers, starting from the substrate surface:

Undercoat
  3 nm titanium dioxide
  22.5 nm tin oxide ($SnO_2$)
  10 nm zinc oxide
Reflective layer
  10 nm silver
Overcoat
  2.5 nm titanium for conversion to titanium dioxide
  12.5 nm zinc oxide
  10 nm tin oxide
  12 nm titanium dioxide.

19 Claims, No Drawings

COATED GLAZING MATERIAL

CROSS-REFERENCE TO RELATED APPLICATION

The subject matter of this Application is closely related to Applicants' copending application Ser. No. 07/458,386 filed Dec. 28th, 1989 now U.S. Pat. No. 5,110,662.

BACKGROUND OF THE INVENTION

1. Field of the Invention

The invention relates to coating glazing material. In particular it relates to a coating which comprises several layers of material deposited in a defined and advantageous sequence upon the glazing.

The expression "glazing material" is used herein to denote sheets of plastics or vitreous material which are used in the performance of the glazier's art. "Vitreous material" includes glass and vitrocrystalline material. Such sheets are most often transparent and clear, but they may be coloured and/or they may be merely translucent or even opaque. As an example of an opaque glazing panel may be cited a panel for mounting beneath a transparent panel, for example in an interior partition, where it is desired to reproduce the texture of the upper transparent panel without allowing sight through such lower panel.

2. Description of the Related Art

The wide variety of uses for glazing sheets and panels has led to a considerable breadth of knowledge on coating the glazing so as to improve particular qualities. Coatings may for example be provided to protect the glazing surface, to colour the glazing or to create an electrically conducting layer across it.

In recent years considerable research effort has been put into the selection of multi-layer coatings which impart low emissivity and/or other optical or energy transmitting or reflecting properties to glazing panels for use in vehicles and buildings.

One aim has been to reduce heat loss from within the space enclosed by the panel, while neither preventing the admission of solar heat nor hindering a high level of light transmission in both directions. One previously proposed way of achieving this has been to provide low emissivity qualities by employing a coating made up of several thin layers of materials which complement each other to achieve the desired result.

Most of the required optical features can in principle be provided by a single coating of reflective metal, for example silver, applied as a layer sufficiently thin to permit transmission of most of the radiation in the visible portion of the spectrum while reflecting most of the infra red portion. If used alone however such a thin metal layer tarnishes in the atmosphere, giving discolouration, reduction of light transmission and a tendency to fragment. It is also of limited mechanical strength and thus prone to chipping, especially at the edge of the glazing panel, and to abrasion.

Other layers are therefore applied in combination with the reflective layer so as to protect it physically against abrasion and chemically against corrosion. These further layers must moreover be selected from materials which do not significantly weaken the optical properties of the coated glazing. The layers immediately adjacent the reflective layer are most commonly of metal oxides, sometimes in combination with other materials such as varnishes, plastic laminates or further sheets of glazing. Such adjacent layers are employed in some instances to improve the optical qualities by acting as a non-reflective layer for the visible portion of the spectrum.

One of the most commonly used coating materials is tin oxide, typically applied as a layer on both sides of the reflective metal layer. This provides many of the required qualities and is also generally inexpensive. It has good optical properties especially as a non-reflective layer (if applied to an appropriate thickness) and also binds well to the adjacent layers. It has been used both under the reflective metal and above it. There have also been several prior proposals to add to the tin oxide, or replace part of it, with a further metal or metal oxide to maintain particular chemical, physical or optical qualities of the coating as a whole. The choice of added materials, and the sequence in which they are applied to the glazing, is however a complex matter since there is a tendency for a material selected to improve one quality to diminish one or more of the others. This may in turn call for a further layer to correct the adverse effect on such other qualities.

A typical example of the complex layer structure that results is described and claimed in European patent specification EP-A-226993. This discloses a high transmittance low emissivity coating on a glass substrate which includes an oxide reaction product of an alloy containing zinc and tin as a first transparent anti-reflective film, copper as a primer film deposited on the first film, silver as a transparent infrared-reflective film deposited on the primer, an oxide reaction product of an alloy containing zinc and tin as a second transparent anti-reflective film deposited on the silver and titanium dioxide as a protective overcoat.

Similar coatings are described in European patent specification EP-A-104870 which discloses in example 1 a float glass pane coated in turn with a tin oxide layer, a silver layer, a copper layer and a further layer of tin oxide. Each of the tin oxide layers is 30–50 nm thick, the silver layer 8 to 12 nm and the copper layer just 1 to 5 nm.

European patent specification EP-A-275474 describes and claims a high transmittance, low emissivity heatable article comprising a transparent nonmetallic substrate, a first transparent anti-reflective metal oxide film comprising zinc deposited on a surface of said substrate, a transparent infrared reflective metallic film deposited on said anti-reflective metal oxide layer, a metal-containing primer layer deposited on said infrared reflective metallic film, wherein said metal is selected from the group consisting of titanium, zirconium, chromium, zinc tin alloy and mixtures thereof, and a second transparent anti-reflective metal oxide film comprising zinc deposited on said metal-containing primer film.

A proven technique for applying such layers is cathodic sputtering. This is conducted at very low pressures, typically of the order of 0.3 Pa, to give a layer of the coating material across the glazing surface. It can be conducted under inert conditions, for example in the presence of argon, but alternatively can be effected as reactive sputtering in the presence of a reactive gas such as oxygen.

European patent specification EP-A-183052 describes the use of reactive sputtering of a cathode target of an alloy of zinc and tin in an oxygen atmosphere so as to apply to a substrate of glazing material an oxide reaction product of the alloy.

European patent specification EP-A-219273, which is largely concerned with an electrically conductive coating for motor vehicle windows, describes a coating process (and the product thereof) in which a dereflecting layer such as zinc oxide is first deposited, followed by a transparent silver layer, a sacrificial metal layer (for example of titanium), a layer of titanium dioxide and a second dereflecting layer. In this process both the dereflecting layers are deposited by reactive sputtering.

SUMMARY OF THE INVENTION

The present invention is directed towards the problem of providing a combination of protective layers for a glazing sheet with a silver reflective layer so as not only to protect the silver against corrosion, but to do so without entailing an adverse effect on the optical properties of the glazing as conferred on it by the properties of the glazing material itself and the silver layer.

According to the invention there is provided a substrate of glazing material carrying a multi-layer coating which comprises a reflective layer of silver sandwiched between a transparent undercoat and a transparent overcoat, characterised in that the undercoat for the silver layer comprises at least one layer of a metal oxide, and in that the overcoat for the silver layer comprises a layer of an oxide of a sacrificial metal selected from the group consisting of titanium, aluminium, stainless steel, bismuth, tin and mixtures of two or more thereof, and formed by initial deposition of the sacrificial metal and its conversion to oxide, a layer of zinc oxide having a thickness not greater than 15 nm, and an uppermost overcoating layer of metal oxide selected from the group consisting of tin oxide, bismuth oxide, aluminium oxide, titanium dioxide and mixtures of two or more thereof.

The invention also provides a process of depositing a multi-layer coating on a substrate of glazing material which coating comprises a reflective layer of silver sandwiched between a transparent undercoat and a transparent overcoat, characterised in that the undercoat for the silver layer is formed by depositing at least one layer of a metal oxide, and in that the overcoat for the silver layer is formed by depositing in sequence a layer of a sacrificial metal selected from the group consisting of titanium, aluminium, stainless steel, bismuth, tin and mixtures of two or more thereof, and converting the metal to oxide, a layer of zinc oxide having a thickness not greater than 15 nm, and an uppermost overcoating layer of metal oxide selected from the group consisting of tin oxide, bismuth oxide, aluminium oxide, titanium dioxide and a mixture of two or more thereof.

The specific combination of metal oxide and metal layers as defined in the present invention offers several important advantages over prior proposals. Thus it provides a coated substrate of glazing material having the desired optical properties which can be left substantially unaffected in an adverse manner by the application of a said undercoat and overcoat of appropriate thicknesses, as will be adverted to later in this specification. It further provides a significant improvement in the resistance to corrosion of the silver layer not only through the process of manufacturing the coated substrate but also throughout the life of the coated product. A uniform quality of product is obtained, both in terms of uniformity of coating across the whole area of the substrate, even for large substrates (for example measuring up to 6 meters in length), and in terms of consistency of product quality over a long production run. The process of applying the coating is readily conducted and can be reliably reproduced, again through a long production run if required.

It seems that the improvements are primarily achieved by ensuring a low thickness of zinc oxide. The location of this thin layer of zinc oxide above the sacrificial metal layer in the overcoat is also important. Another factor is that the zinc oxide may diffuse through the sacrificial barrier layer to effect a degree of passivation of the silver. It may also be that the presence of the zinc oxide enhances the oxidation of the sacrificial metal such that while oxidation of the sacrificial metal is completed oxidation of the silver is avoided. A said zinc oxide layer can be formed so that it is very compact and substantially prevents atmospheric oxygen from penetrating to the silver layer.

Whatever the reaction mechanism, it is the case that by ensuring uniform and complete oxidation over the whole area of the sacrificial metal, the presence of zinc oxide in the thickness and location defined by the invention provides a reproducible means of achieving the desired qualities in the product.

The benefits of the invention are particularly marked in the case of low emissivity glazing panels for buildings, which are often employed with a second panel to form a double glazing unit. The invention can however also be applied to anti-solar panels, to automobile windows and to mirrors. The main difference in the coatings for these different uses lies in the thickness of the silver layer. Typical thicknesses of silver for anti-solar panels lie in the range 24 to 28 nm. Mirrors typically have silver layers with a thickness in excess of 40 nm, and for low emissivity coatings, silver layer thicknesses are usually in the range 8 to 12 nm. In the case of automobile windows, the use of a sacrificial metal also helps in protecting the silver layer through any subsequent heat treatment, for example a tempering or bending step to which a vitreous glazing sheet might be subjected.

It is envisaged that the widest use of the present invention will be in conjunction with transparent substrates, and glass is the preferred glazing material.

The preferred deposition technique for the purposes of the invention is magnetically enhanced sputtering. This is not only quick and convenient in use but also gives excellent physical qualitites to the deposited layers in terms of uniformity of thickness, cohesion within the layer and adhesion to adjacent layers. A cathode of each of the required metals, to be applied as such or to form a metal oxide, is activated at the required stage of the deposition. One particularly convenient form of cathode is a rotary unit comprising a rotating hollow cylinder cooled internally by a coolant fluid such as water. A multi-cathode sputtering chamber is generally preferred so as to facilitate the application of different combination of metals and metal oxides.

The preferred configuration of layers can be conveniently achieved in a multi-cathode sputtering chamber in which different cathodes provide the sources of the different materials to be deposited. The order in which the oxides are deposited is controlled by the order in which the sources are disposed in the sputtering zone and by the direction of movement of the substrate of glazing material past the cathodes.

Depositing more than one layer in a single pass is advantageous in giving full use of the sputtering apparatus and rapid build up of the required coating. The simultaneous depositing of a mixture of metals or metal oxides is similarly effected in a single pass, but in this case the source can either be two or more different metal cathodes simultaneously activated or be a single cathode comprising an alloy of the required metals.

The silver and the sacrificial metal layers should each be deposited in an inert atmosphere, for example of argon. The other layers can either be produced by depositing oxide as such or, preferably, by reactive sputtering of the respective metal in an oxygen-containing atmosphere. The working pressure for the sputtering is preferably in the range 0.15 to 0.70 Pa.

In the sputtering of metal in an oxygen-containing atmosphere the oxide product is not necessarily obtained in the fully oxidised state. At least part of the product may be present as a sub-oxide or even in the metallic state. Subsequent depositions in a reactive atmosphere and any subsequent heat treatment of the coated panel do however tend to complete the oxidation of any residual metal or sub-oxides formed in the earlier deposition.

In the case of the sacrificial metal, which serves the purpose of protecting the silver layer against oxidation, this is converted to oxide during any subsequent exposure to an oxidising atmosphere. This is usually mostly effected during subsequent deposition of metal oxide, but also occurs during any subsequent heat treatment or during prolonged storage. If the silver is not so protected, the coated substrate of glazing material loses its low emissivity and its light transmission is dramatically reduced. The preferred sacrificial metal is titanium, which has the advantages of being easily oxidised and of forming an oxide of very low absorbency. We have discovered that the use of titanium as sacrificial metal gives a very effective barrier against oxidation of the silver.

Each of the materials used in the coating has optical, chemical and physical properties which contribute to the properties of the coating as a whole. Collectively the properties may include not only low emissivity and high light transfer but also chemical resistance to corrosion at both ambient and elevated temperatures and over prolonged periods. The physical properties include good adhesion to the substrate and to each other and good resistance to wear, for example against chipping or flaking and abrasion.

Optically each of the metal oxide layers permits good transmission of light and heat radiation and the silver layer reflects heat radiation.

Chemically the need is to protect the reflective metal against oxidation. This is achieved partly by encasing the reflective metal within further metal or metal oxide layers that reduce or eliminate access of oxygen and partly by including materials having greater reactivity than the reflective metal has for oxygen.

In the coating according to the invention the properties contributed by each successive layer include the following:

The first metal oxide layer has good light transmission properties, is chemically inert and physically provides a good bond with the substrate.

The reflective metal reduces emission of heat radiation while permitting light transmission.

The sacrificial metal layer is a protective layer for the reflective metal and reacts with any oxygen that comes into contact with it.

The overcoat layer of zinc oxide having the limited thickness defined above has good properties of light transmission and also serves as a barrier to ingress of oxygen into the layers beneath it.

The uppermost layer of metal oxide is highly transparent, non-reflective and provides for the lower layers a protective barrier having good chemical and weathering resistance.

The transparent metal oxide layer of the undercoat can be selected from tin oxide (including "indium tin oxide" i.e. a tin oxide doped with indium), titanium dioxide, bismuth oxide, aluminium oxide or a mixture of two or more of these oxides. It can usefully be present as a plurality of layers of different oxides. The preferred oxides are tin oxide and titanium dioxide. One preferred configuration is a layer of titanium dioxide deposited on the substrate of glazing material and a layer of tin oxide deposited on the said titanium dioxide.

We have found that surprisingly the presence of the layer of zinc oxide also permits some reduction in the thickness of the sacrificial metal layer while avoiding oxidation of the silver layer. This assists in achieving a high luminous transmission since the sacrificial metal is more easily, completely and uniformly oxidised. This benefit is most marked if the depositing of the oxide layers of the overcoat is conducted in a substantially pure oxygen atmosphere.

Our copending Patent Application, entitled "Coated glazing material and process of coating same" and filed on the same date as this application, which claims priority from United Kingdom Patent Application No 89 00 166.3 dated Jan. 5th 1989, described and claims a configuration of layers in which a layer of zinc oxide is included in the undercoat beneath a reflective layer of silver. Such a zinc oxide layer can if desired be included in a coating according to the present invention, subject to certain reservations discussed below.

The beneficial effects of the layer of zinc oxide above the sacrificial metal layer of the overcoat make this zinc oxide layer an essential feature of the invention. Nevertheless certain negative features of zinc oxide necessitate that the total quantity of zinc oxide is kept as low as possible. Thus compared with tin oxide, zinc oxide is less chemically resistant and more prone to weathering.

Thus it is known that a coating which includes a layer of zinc oxide cannot generally be used for the external surface of a substrate of glazing material, even if an opacifying layer is placed on top of the zinc oxide, because these layers are not resistant to atmospheric conditions. Similar problems arise with a mixture of zinc oxide and tin oxide. Such layers generally have utility only in use in the internal surface of a sealed double glazing panel. If a glazing panel is to be laminated with PVB, the presence of zinc oxide gives problems with the adhesive employed to bond the laminate, such that separation of the different layers will occur unless an additional and compatible bonding layer, for example of chromic oxide, is interposed.

Zinc oxide is also unsuitable for use at the borders of a window pane to which adhesives are to be applied: it tends to react with the adhesive and should therefore be removed. There is a related problem in that the reflective metal layer tends not to adhere strongly to the adjacent layers and should also be removed before an adhesive is applied. Thus one embodiment of the invention is a coated substrate of glazing material in which a strip of adhesive is applied around the periphery of one face of the substrate and the coating according to the invention is applied to the remainder of the said face, thereby ensuring that the periphery has no zinc oxide layer. This configuration of coating and adhesive strip is most conveniently achieved by first depositing the coating layers according to the invention across the whole of one face of the substrate, then removing the coating layers from a peripheral marginal portion of the said face, and finally applying the adhesive strip to the marginal portion. Removal of the coating layers involves certain problems in that the zinc oxide, being relatively soft, tends to act like a soft lubricant, to stretch rather than break away and having been broken away to pollute the removal means. A robust physical method of removing the marginal portion of the coatings is accordingly required, the use of an abrasive mill being particularly preferred.

Such adhesive-bordered panels are employed in double glazing units. The provision of an effective adhesive is important here to ensure a long-lasting hermetically sealed space between the two panels, and again the marginal portion should be removed before application of the adhesive strip.

Most importantly in terms of the present invention although the zinc oxide is deposited in an amorphous form it has a tendency to undergo crystalline growth, for example in a direction perpendicular to the glazing, and thereby to create a relatively bulky layer from a given weight of material. Not only does this conflict with the object of the invention to have a stable and uniform layer structure, but it also leads to a weaker physical strength within the layer and is probably the reason for the reduced chemical resistance discussed above.

Accordingly the invention requires that in selecting the thickness of the overcoat zinc oxide layer a balance is struck between the minimum quantity required to give good protection to the adjacent layers and the maximum quantity to avoid introducing physical weakness and chemical reactivity into the coating. As defined above, the maximum permissible thickness is 15 nm and the preferred lower limit is 5 nm. Most preferably the thickness is in the range 7 to 13 nm.

If in addition to a zinc oxide layer above the sacrificial metal in the overcoat the coating also includes a zinc oxide layer immediately beneath the reflective layer, in the undercoat, as proposed in our copending application then particular care must be taken to minimise the negative features of the presence of zinc oxide in the coating. In this configuration the overcoat and undercoat zinc oxide layers preferably have substantially the same thickness as each other both being preferably in the range 5 to 14 nm thick.

For the purpose of providing low emissivity and high light transmission, the thickness of the silver layer should preferably lie within the narrow limits of 8 nm to 12 nm. Below this range the degree of infra red reflection is generally insufficient and above it the metal imposes too great a barrier to light transmission. Within the defined limits the invention reliably and reproducibly permits the achievement of an emissivity below 0.1.

With regard to the thickness of the other layers these must be chosen relative to the thickness of silver and zinc oxide layers and relative to each other so as to determine the combined optical path (the product of thickness and refractive index for each layer) which gives the desired optical appearance to the coated substrate. For a low emissivity coating the requirement is for a coating with as neutral a reflective tint as possible, but with a bluish appearance in preference to any other colour. Moreover a weak luminous reflection is sought in order to obtain a high luminous transmission. In general the required optical properties will be obtained within a total thickness of 30 to 45 nm on either side of the silver layer, but it is to be understood that because of the different refractive indices of certain of the different materials reducing the thickness of one layer may require adjustment of the thickness of one or more other layer to restore the required tint.

The sacrificial metal layer is preferably of a thickness in the range 2 to 12 nm, and in some embodiments, it is preferably of a thickness in the range 2 to 3 nm. A balance has to be struck between including sufficient material to react with any oxygen which permeates into contact with it and to maintaining the required light transmission properties. The low thickness of metal layer which can be achieved according to the present invention results from the presence of the zinc oxide layer immediately above it. In its metallic state this layer represents a barrier to good light transmission and thus requires a minimal thickness if the light transmission of the overall coating is to be within acceptable limits. The transmission properties of this metal layer do however improve when it is oxidised. This occurs during deposition of subsequent layers and also during any heat treatment step, such as a bending treatment and/or a tempering treatment for the substrate. Thicker layers, e.g. 5 to 12 nm are recommended if such a later heat treatment is to be undergone. Desirably all of the sacrificial metal is oxidised thereby producing a layer of non-reflective, light transmitting metal oxide.

The relative proportions of tin oxide and titanium dioxide in the undercoat are generally not critical. Practical convenience in employing a multi-cathode sputtering apparatus may require that they are both deposited in a single pass of the substrate. In one advantageous embodiment of the invention, the tin oxide represents the greater part of the undercoat. In this embodiment the thickness of tin oxide is preferably in the range 15 to 30 nm and the thickness of titanium dioxide in the range 2 to 8 nm. As discussed above any zinc oxide in the undercoat preferably has a thickness in the range 7 to 13 nm. Because titanium dioxide has a higher refractive index than tin oxide, in substituting part of the one oxide by the other the thickness of the titanium dioxide should be about 75% of the thickness of the tin oxide in order to give the equivalent optical properties.

The overcoat preferably includes a layer of tin oxide deposited between said zinc oxide layer and a said uppermost layer, such uppermost layer being of titanium dioxide. Although not essential this further intermediate layer of the overcoat gives subjacent layers of the coating additional protection against wear and abrasion, and provided the thickness of the other metal oxide in the overcoat is proportionately reduced, it does not significantly change the optical properties of the coating. A tin oxide layer of high compactness and thus good abrasion resistance is easier to deposit than a highly compact titanium oxide layer.

The uppermost layer of titanium dioxide preferably applied as a protective coating on the top of the coating stack should desirably have a thickness in the range 8 to 15 nm.

Zinc oxide and tin oxide have substantially the same refractive index as each other and thus from an optical viewpoint are interchangeable with each other without any adjustment in layer thickness.

The most discernable optical difference in switching the relative proportion of the thickness of the different layers in the coating stack is a slight change in tint of the overall coating.

The present invention provides a coated substrate of glazing material with an emissivity of about 0.08 and a light transmission of up to 87% for coatings with a blue reflective tint. If a neutral or reddish tint is required or permissible then a higher light transmission of about 88% can be obtained. This represents a significant advance over the optical properties of coated glass substrates of the prior art.

The invention offers the advantage that such results can be uniformly and reproducibly obtained even on a large scale. In particular the invention allows a light transmission of 87% (blue tint) to be easily and reproducibly obtained over the full extent of a large sheet of glass (typically 6 meters by 3 meters).

In manufacturing terms the invention permits easy adjustment of the properties to be imparted to the product. This is most marked in regard to the required thickness of the sacrificial metal layer to obtain the desired emissivity, luminous transmission and reflective tint, since the presence of the upper zinc oxide layer according to the invention makes less critical the precise thickness of sacrificial metal to achieve the desired properties.

DESCRIPTION OF THE PREFERRED EMBODIMENTS

The invention is described below with reference to the following examples.

EXAMPLE I

A window glass panel of 4 mm thick float glass with an emissivity of 0.84 and light transmission of 89% was introduced into a processing chamber comprising five planar magnetron sputtering sources, having targets of respectively titanium, tin, zinc, titanium and silver, an entry- and an outlet-gas lock, a conveyor for the glass, power sources, sputtering gas inlets and an evacuation outlet.

The pressure in the chamber was reduced to 0.15 Pa. The panel was transported past the sputtering sources with the first titanium, tin and zinc sources activated and cold sputtered by oxygen gas at an effective depositing pressure of 0.2 Pa to give a titanium dioxide layer following by a tin oxide layer and zinc oxide layer on the substrate. The oxygen was then evacuated and the substrate moved back past the sputtering sources with the silver and second titanium sources activated but this time with argon as the sputtering gas, to add a silver layer and a titanium layer, and the zinc, tin and first titanium sources activated, with oxygen as the sputtering gas, to give further layers of zinc oxide, tin oxide and titanium dioxide. The resulting coating had the following composition, from the glass surface:

Undercoat
3 nm titanium dioxide
22.5 nm tin oxide ($SnO_2$)
10 nm zinc oxide
Reflective layer
10 nm silver
Overcoat
2.5 nm titanium for conversion to titanium dioxide
12.5 nm zinc oxide
10 nm tin oxide
12 nm titanium dioxide.

The coated glass panel had an emissivity of about 0.08 and light transmission of about 87%, both across the whole surface of the panel (measuring 6 meters by 3 meters). The coating presented a bluish (blue-green) reflective tint. Its colour indices L, a, b (Hunter reflectivity, measured on the coated face by a "Spectrogard Color System" colorimeter from the Pacific Scientific Division of Gardner Neotec, 24–31 Lindenlane, Silver Spring, Md. 20910 USA) were L=approximately 23, a=approximately $-1.5$ and b=approximately $-4$. The values were measured with a CIE D 65 illumination. From the value of $L_{R,C}=23$ it can be calculated that the luminous reflection $R_L$ was approximately 5.3%.

The settings, in particular the thickness of the titanium layer, necessary to obtain these optical properties, were readily obtained, and could be controlled to maintain those properties, so that substantially all glazing panels produced during a series production run met the required quality control standards.

In a variant of this Example, particularly suitable where the glass is to be subjected to a bending and/or tempering treatment, the thickness of the titanium sacrificial layer of the overcoat is increased to 7 nm: other coating layers and thickness remain the same.

EXAMPLE II

In a variation of Example 1, a similar coated glass panel was prepared in the same apparatus as Example 1 but with the upper and lower layers formed of a thicker layer of tin oxide and no adjacent layer of titanium dioxide, as follows:

Undercoat
26 nm tin oxide
10 nm zinc oxide
Reflective layer
10 nm silver
Overcoat
2.5 nm titanium for conversion to titanium dioxide
12.5 nm zinc oxide
25 nm tin oxide.

This coated glass panel possessed the same uniform optical properties as that of Example 1 but had a slightly reduced resistance to abrasion.

EXAMPLE III

A further coated glass panel was prepared in the same apparatus as Example 1, but with a single, relatively thick layer of tin oxide in contact with the glass, i.e. having the following composition:

Undercoat
28 nm tin oxide
10 nm zinc oxide
Reflective layer
10 nm silver
Overcoat
2.5 nm titanium for conversion to titanium dioxide
10 nm zinc oxide
10 nm tin oxide
12 nm titanium dioxide.

This coated glass panel had a light transmission of about 88% and an emissivity of about 0.08, both uniformly across the panel surface (measuring 6 meters$\times$3 meters). It had a more neutral reflective tint than the other examples. The Hunter reflective indices L, a, b were L=about 22, a=about $-0.5$ and b=about $-3$. From the value L=about 22 it can be calculated that the luminous reflection $R_L$ was about 4.8%.

EXAMPLE IV

A further coated glass panel was prepared in the same apparatus as Example 1, except that the second titanium source was replaced by a target of 316 stainless steel. The multi-layer coating was deposited to the following composition and thicknesses:

Undercoat
15 nm tin oxide ($SnO_2$)
14 nm zinc oxide
Reflective layer
10 nm silver
Overcoat
8 nm stainless steel for conversion to oxide
14 nm zinc oxide
10 nm titanium dioxide.

In a variant of this Example, the coating was deposited as follows:

Undercoat
15 nm tin oxide ($SnO_2$)
14 nm zinc oxide
2 nm stainless steel for conversion to oxide
Reflective layer
10 nm silver
Overcoat
6 nm stainless steel for conversion to oxide
14 nm zinc oxide
10 nm titanium dioxide.

Values of the thicknesses of the various coating layers as set out in this specification are values measured by an ellipsometric method as described by K. L. Chopra in "Thin Film Phenomena" (McGraw-Hill) using an AUTOEL II TM ellipsometer manufactured by Rudolph Research of Flanders, N.J. This apparatus uses a He-Ne laser source (lambda = 632.8 nm) and measurements are taken in reflection with an angle of incidence of 70°.

What is claimed is:

1. An article, comprising:
   a glazing material coated with a multi-layer coating comprised of a reflective layer of silver sandwiched between a transparent undercoat and a transparent overcoat,
   wherein said transparent undercoat is provided on said glazing material and comprises at least one layer of at least one metal oxide, and
   wherein said transparent overcoat comprises a layer of an oxide of at least one sacrificial metal selected from the group consisting of titanium, aluminum, stainless steel, bismuth, tin, and mixtures thereof, formed by initial deposition of said at least one sacrificial metal onto said reflective layer of silver and conversion thereof to said oxide, a layer of zinc oxide having a thickness ranging from 5 to 14 nm, and an uppermost overcoating layer of at least one metal oxide selected from the group consisting of tin oxide, bismuth oxide, aluminum oxide, titanium dioxide and mixtures thereof.

2. The article recited in claim 1, wherein said at least one sacrificial metal is titanium.

3. The article recited in claim 1, wherein said layer of zinc oxide has a thickness ranging from 7 to 13 nm.

4. The article recited in claim 1, wherein said transparent undercoat has a total thickness and said transparent overcoat has a total thickness, and wherein each said total thickness ranges from 30 to 45 nm.

5. The article recited in claim 1, wherein said reflective layer of silver has a thickness ranging from 8 to 12 nm.

6. The article recited in claim 5, wherein the article has an emissivity of less than 0.1.

7. The article recited in claim 1, wherein said at least one layer of at least one metal oxide of said transparent undercoat is selected from tin oxide and titanium dioxide.

8. The article recited in claim 7, wherein said at least one layer includes a layer of tin oxide and a layer of titanium dioxide, wherein said layer of tin oxide has a thickness ranging from 15 to 30 nm, and wherein said layer of titanium dioxide has a thickness ranging from 2 to 8 nm.

9. The article recited in claim 1, wherein said at least one layer of at least one metal oxide of said transparent undercoat includes two or more different metal oxides.

10. The article recited in claim 9, wherein there are two different layers of metal oxides including a layer of titanium dioxide deposited on said glazing material and a layer of tin oxide deposited on said titanium dioxide.

11. The article recited in claim 1, wherein said transparent undercoat includes a layer of zinc oxide deposited immediately beneath and in contact with said reflective layer of silver.

12. The article recited in claim 11, wherein said layer of zinc oxide of said transparent undercoat and said layer of zinc oxide of said transparent overcoat each have a thickness, which thicknesses are substantially the same, and wherein each said thickness ranges from 5 to 14 nm.

13. The article recited in claim 1, wherein said layer of an oxide of at least one sacrificial metal has a thickness ranging from 2 to 12 nm.

14. The article recited in claim 13, wherein said layer of an oxide of at least one sacrificial metal has a thickness ranging from 2 to 3 nm.

15. The article recited in claim 1, wherein said transparent overcoat further comprises a layer of tin oxide deposited between said layer of zinc oxide and said uppermost overcoating layer, and wherein said uppermost overcoating layer is titanium dioxide.

16. The article recited in claim 15, wherein said uppermost overcoating layer of titanium dioxide has a thickness ranging from 8 to 15 nm.

17. The article recited in claim 1, wherein said glazing material is transparent.

18. An article, comprising:
   a glazing material coated with a multi-layer coating comprised of a reflective layer of silver sandwiched between a transparent undercoat and a transparent overcoat,
   wherein said transparent undercoat is provided on said glazing material and comprises at least one layer of at least one metal oxide,
   wherein said transparent overcoat comprises a layer of an oxide of at least one sacrificial metal selected from the group consisting of titanium, aluminum, stainless steel, bismuth, tin, and mixtures thereof, formed by initial deposition of said at least one sacrificial metal onto said reflective layer of silver and conversion thereof to said oxide, a layer of zinc oxide having a thickness ranging from 5 to 14 nm, and an uppermost overcoating layer of at least one metal oxide selected from the group consisting of tin oxide, bismuth oxide, aluminum oxide, titanium dioxide and mixtures thereof, and wherein said glazing material has one face including a peripheral margin and a remainder area, wherein said article is provided with a strip of adhesive around said peripheral margin, and wherein said multi-layer coating is provided on said remainder area of said one face.

19. The article recited in claim 18, wherein said layer of zinc oxide of said transparent overcoat has a thickness ranging from 5 to 14 nm.

* * * * *